(12) United States Patent
Moriwaki et al.

(10) Patent No.: US 7,368,332 B2
(45) Date of Patent: May 6, 2008

(54) SOI SUBSTRATE MANUFACTURING METHOD

(75) Inventors: Ryuji Moriwaki, Zama (JP); Kiyoaki Ogawa, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 135 days.

(21) Appl. No.: 11/300,863

(22) Filed: Dec. 14, 2005

(65) Prior Publication Data

US 2006/0128078 A1   Jun. 15, 2006

(30) Foreign Application Priority Data

Dec. 15, 2004   (JP)   ............. 2004-363672

(51) Int. Cl.
*H01L 21/00* (2006.01)
(52) U.S. Cl. ............. 438/149; 438/458; 438/455; 257/E21.086; 257/E21.088
(58) Field of Classification Search ............. 438/458, 438/149
See application file for complete search history.

(56) References Cited

U.S. PATENT DOCUMENTS

| | | | | |
|---|---|---|---|---|
| 5,152,857 A | * | 10/1992 | Ito et al. ............. | 156/153 |
| 5,233,218 A | * | 8/1993 | Miura ............. | 257/618 |
| 5,665,631 A | * | 9/1997 | Lee et al. ............. | 438/459 |
| 5,834,812 A | * | 11/1998 | Golland et al. ............. | 257/347 |
| 5,863,829 A | * | 1/1999 | Nakayoshi et al. ............. | 438/459 |
| 6,263,941 B1 | * | 7/2001 | Bryan et al. ............. | 156/584 |
| 6,583,029 B2 | * | 6/2003 | Abe et al. ............. | 438/455 |
| 6,624,047 B1 | * | 9/2003 | Sakaguchi et al. ............. | 438/458 |
| 6,653,205 B2 | * | 11/2003 | Yanagita et al. ............. | 438/455 |
| 7,238,589 B2 | * | 7/2007 | Cohen et al. ............. | 438/455 |
| 2003/0008478 A1 | * | 1/2003 | Abe et al. ............. | 438/459 |
| 2005/0161808 A1 | * | 7/2005 | Anderson ............. | 257/730 |

FOREIGN PATENT DOCUMENTS

| | | |
|---|---|---|
| JP | 5-21338 | 1/1993 |
| JP | 5-211128 | 8/1993 |
| JP | 8-195483 | 7/1996 |

* cited by examiner

*Primary Examiner*—Hsien-Ming Lee
*Assistant Examiner*—Ankush K Singal
(74) *Attorney, Agent, or Firm*—Morgan & Finnegan, L.L.P.

(57) ABSTRACT

This invention makes it possible to simplify a process of manufacturing an SOI substrate whose insulator is not exposed to the side surface. The SOI substrate manufacturing method includes a first step of forming a structure (230) in which an insulating layer (204b) and semiconductor layer (203b) are in turn formed on a semiconductor member (211) by bonding a first substrate (210) to a second substrate (220), a second step of making the edge portion of an insulating layer (204b) of the structure (230) retreat toward the center so that the edge portion of a semiconductor layer (203c) overhangs the edge portion of an insulating layer (204c), and a third step of moving atoms which form the edge portion of the semiconductor layer (203c) such that the edge portion of a semiconductor layer (203d) covers the periphery of the insulating layer (204c) and connects to the semiconductor member (211).

6 Claims, 5 Drawing Sheets

SOI SUBSTRATE MANUFACTURING METHOD

FIELD OF THE INVENTION

The present invention relates to an SOI substrate manufacturing method.

BACKGROUND OF THE INVENTION

In manufacturing an SOI (Semiconductor On Insulator) by bonding two substrates, the following representative methods can be used.

In the first method, two substrates are bonded while inserting an oxide film between them. Grinding and polishing are performed from the lower surface of one of the two substrates to leave a semiconductor layer (SOI layer) having a desired thickness on the oxide film.

The second method uses porous Si (see Japanese Patent Laid-Open No. 5-21338). In the representative process of this technique, a porous Si layer, epitaxial Si layer, and oxide film are in turn formed on a seed substrate. After that, the resultant substrate is bonded to a handle substrate to manufacture a bonded substrate, and the bonded substrate is then divided using a porous layer.

The third method uses hydrogen ion implantation (see Japanese Patent Laid-Open No. 5-211128). In the representative process of this technique, hydrogen ions or rare gas ions are implanted into an Si substrate having an oxide film to form an ion-implanted layer. The resultant substrate is bonded to a handle substrate to manufacture a bonded substrate. The ion-implanted layer is then changed into a micro-cavity layer by annealing, thereby dividing the bonded substrate.

SOI substrates manufactured by the above manufacturing methods have a structure in which an insulating film ($SiO_2$) is exposed to the side surface of the SOI substrate. As a result, the insulating film ($SiO_2$) exposed to the side surface of the SOI substrate is selectively etched in forming devices such as a transistor. The SOI layer on the insulating layer overhangs like a terrace, and the strength becomes low. In this state, the SOI layer flakes off and produced Si fragments may cause damage to the substrate surface, resulting in a low yield.

Japanese Patent Laid-Open No. 8-195483 discloses a technique to solve the above problem. In this technique, the central portion of the Si substrate is oxidized while the peripheral portion of an Si substrate is masked by an $Si_3N_4$ film. After that, the surface of the Si substrate is polished, thereby manufacturing a first substrate having an oxide film whose peripheral portion is surrounded by Si. The first substrate is bonded to a second substrate to manufacture an SOI substrate.

The method described in Japanese Patent Laid-Open No. 8-195483 can prevent the SOI layer from flaking off by etching the oxide film in manufacturing devices since the oxide film is not exposed to the side surface of the SOI substrate.

However, the method described in Japanese Patent Laid-Open No. 8-195483 complicates the SOI substrate manufacturing process because masking of the peripheral portion of the Si substrate, and polishing after oxidation must be executed.

SUMMARY OF THE INVENTION

The present invention has been made in consideration of the above problem, and has as its object to simplify a process of manufacturing an SOI substrate whose insulator is not exposed to the side surface.

According to the present invention, there is provided an SOI substrate manufacturing method comprising a first step of forming a structure in which an insulating layer and semiconductor layer are in turn formed on a semiconductor member by bonding a first substrate to a second substrate, a second step of making an edge portion of the insulating layer of the structure retreat toward a center so that an edge portion of the semiconductor layer overhangs the edge portion of the insulating layer, and a third step of moving atoms which form the edge portion of the semiconductor layer such that the edge portion of the semiconductor layer covers a periphery of the insulating layer and connects to the semiconductor member.

According to a preferred embodiment of the present invention, preferably, the third step includes a step of annealing the structure having undergone the second step in a reducing atmosphere containing hydrogen.

According to another preferred embodiment of the present invention, the semiconductor or both of the semiconductor layer and the semiconductor member can contain silicon.

According to still another preferred embodiment of the present invention, the insulating layer can contain silicon oxide.

According to still another preferred embodiment of the present invention, the second step can include a step of etching an edge portion of an insulating layer exposed to a side surface of the structure by using an etching solution for selectively etching the insulating layer.

According to still another preferred embodiment of the present invention, the first step can include a step of bonding the first substrate to the second substrate to form a bonded substrate having an insulating layer and second semiconductor member which are in turn formed on the semiconductor member, and a step of, while leaving one part of the second semiconductor member as the semiconductor layer, removing the other part of the second semiconductor member.

According to the still another preferred embodiment of the present invention, the first step can include a step of forming a bonded substrate by bonding the first substrate having a semiconductor layer formed on a separation layer to the second substrate including a semiconductor member while inserting an insulating layer between the first substrate and second substrate, and a step of dividing the bonded substrate by using the separation layer. In this case, the separation layer can be formed by, e.g., anodizing or ion implantation.

According to the present invention, for example, a process of manufacturing an SOI substrate whose insulator is not exposed to the side surface can be simplified.

Other features and advantages of the present invention will be apparent from the following description taken in conjunction with the accompanying drawings, in which like reference characters designate the same or similar parts throughout the Figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

The preferred embodiments of the present invention will be described below in detail with reference to the accompanying drawings.

First Embodiment

A substrate manufacturing method according to the first preferred embodiment of the present invention will be described below. FIGS. 1A to 1F are sectional views schematically showing the SOI (Semiconductor On Insulator) substrate manufacturing method according to the first preferred embodiment of the present invention.

Figure 1A:
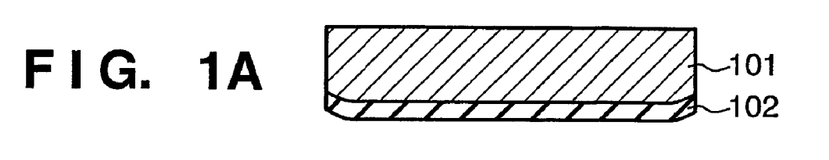
FIGS. 1A to 1F are sectional views schematically showing an SOI (Semiconductor On Insulator) substrate manufacturing method according to the first preferred embodiment of the present invention.

In the step shown in FIG. 1A, a first substrate 101 is prepared. An insulating layer 102 is formed on the major surface of the first substrate 101. As the first substrate 101, for example, a silicon layer such as a single-crystal silicon layer, polysilicon layer, or amorphous silicon layer, Ge layer, SiGe layer, SiC layer, C layer, GaAs layer, GaN layer, AlGaAs layer, InGaAs layer, InP layer, or InAs layer is preferable. As the material of the insulating layer 102, for example, silicon oxide, silicon nitride, silicon oxynitride, aluminum oxide, tantalum oxide, hafnium oxide, titanium oxide, scandium oxide, yttrium oxide, gadolinium oxide, lanthanum oxide, zirconium oxide, or a mixture glass thereof is preferable. The insulating layer 102 can be formed by, e.g., oxidizing the surface of the first substrate 101 or depositing an insulator substance by CVD or PVD. If a second substrate 111 has an insulator on its surface, the step of forming the insulating layer 102 may be omitted.

Figure 1B:
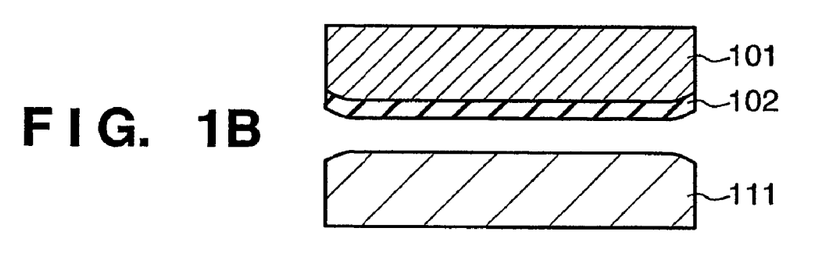

In the step shown in FIG. 1B, the second substrate 111 is prepared. As the second substrate 111, for example, an Si substrate, Ge substrate, SiGe substrate, SiC substrate, C substrate, GaAs substrate, GaN substrate, AlGaAs substrate, InGaAs substrate, InP substrate, InAs substrate, a substrate obtained by forming an insulating layer on these substrates, a transparent substrate such as a quartz substrate, or a sapphire substrate is preferable. However, the second substrate 111 only needs to have a sufficiently flat bonding surface and can be of any other type.

Figure 1C:
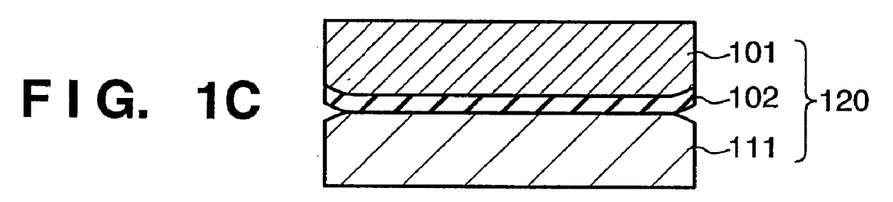

In the step shown in FIG. 1C, the first substrate 101 is brought into contact with the second substrate 111 at room temperature while making the second substrate 111 face the insulating layer 102, thereby forming a bonded substrate 120. The insulating layer 102 can be formed on the first substrate 101, on the second substrate 111, or on both of them. After the first substrate 101 is completely brought into contact with the second substrate 111, a process to make their bonding firm is executed as needed. As an example of this process, preferably, 1) annealing is executed in an $N_2$ atmosphere at 1,100° C. for 10 min and 2) annealing (oxidation) is executed in an $O_2/H_2$ atmosphere at 1,100° C. for 50 to 100 min.

Figure 1D:
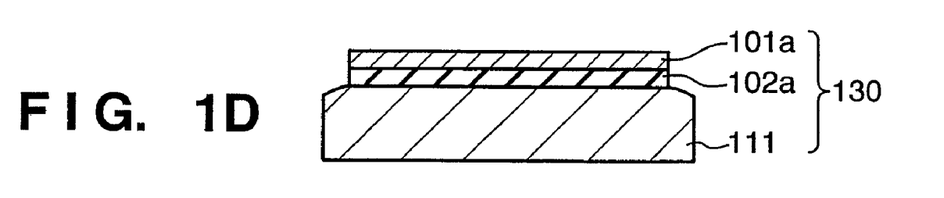

In the step shown in FIG. 1D, the first substrate 101 is ground from the surface opposite to the main surface of the first substrate 101 to form a thin-film structure, thereby forming a semiconductor layer 101a. Typically, the first substrate 101 and second substrate 111 have a beveling portion. The bonded substrate 120 has a peripheral portion with a gap formed by the beveling portions of the first substrate 101 and second substrate 111. For this reason, in forming the thin film of the first substrate 101 by grinding, the peripheral portions of the first substrate 101 and insulating layer 102 (i.e., portions which are not supported by the second substrate 111) may be removed. This makes the areas of the semiconductor layer 101a and insulating layer 102a smaller than those of the original first substrate 101 and insulating layer 102. An SOI substrate 130 can be obtained by this process to have the insulating layer 102a, on which the semiconductor layer (SOI layer) 101a is formed, as a buried insulator on the second substrate 111 serving as a support member.

Figure 1E:
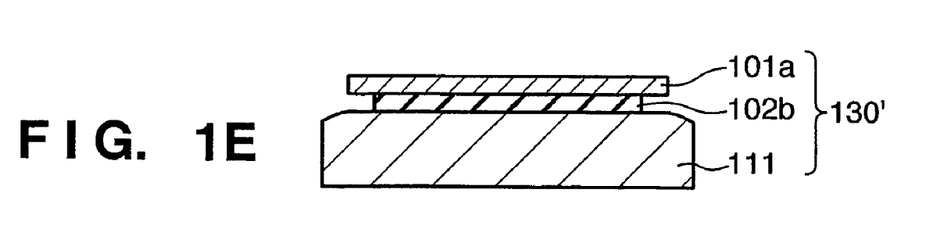

In the step shown in FIG. 1E, the peripheral portion of the insulating layer 102a is removed by, e.g., etching to make the position of the edge portion of the insulating layer 102a retreat inward (toward the center). This process can be executed by using an etching solution which can be used to selectively etch the insulating layer 102a with respect to the semiconductor layer 101a. For example, assume that the semiconductor layer 10a is formed of Si, and the insulating layer 102a is formed of an $SiO_2$ layer. In this case, the position of the edge portion of the insulating layer 102a can be made to retreat inward (toward the center) by supplying a solution containing hydrofluoric acid to the edge portion of the SOI substrate 130. This process makes it possible to obtain a structure in which the semiconductor layer 101a overhangs an insulating layer 102b.

Figure 1F:
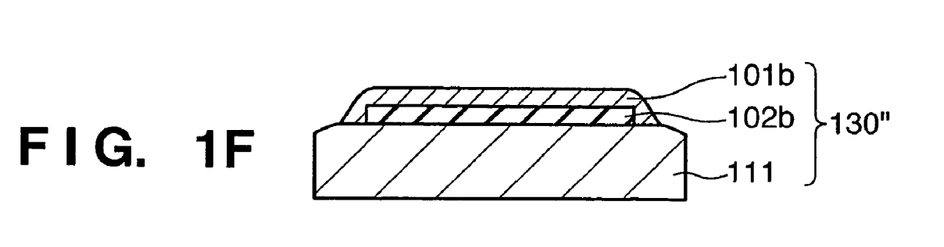

In the step shown in FIG. 1F, the peripheral portion of the semiconductor layer 101a is allowed to fall and connect to the second substrate 111. Hence, an SOI substrate 130" having a semiconductor layer (SOI layer) 101b can be obtained such that the semiconductor layer 101b has a moderately inclined peripheral portion and covers the edge portion of the insulating layer 102b. With this structure of the SOI substrate 130", since the edge portion of the insulating layer 102b is covered with the semiconductor layer 101b, it is excellent in that it is possible to prevent the insulating layer 102b from being etched and the semiconductor layer 101b on it from flaking off in manufacturing devices such as a transistor on the SOI substrate 130.

This process may include annealing an SOI substrate 130' in a reducing atmosphere containing hydrogen. For example, preferably, 1) annealing is executed in an $N_2/H_2$ atmosphere at 1,050° C. for 3 hr, and subsequently, 2) annealing is executed in an $N_2/H_2$ atmosphere at 1,200° C. for 15 min.

Annealing in such reducing atmosphere containing hydrogen accelerates a reduction reaction ($SiO_2+H_2>SiO\uparrow_{+H_2}O\uparrow$) required to etch the edge portion of the insulating layer (e.g., $SiO_2$ layer) 102b. In addition, atoms forming the edge portion of the semiconductor layer (e.g., Si layer) 101a migrate by heat so the edge portion falls. The semiconductor layer 101a is thus connected to the second substrate (e.g., Si substrate) 111 in crystal level. Annealing can also increase the flatness of the surface of an SOI substrate (an SOI layer).

Second Embodiment

A substrate manufacturing method according to the second preferred embodiment of the present invention will be described below. FIGS. 2A to 2F are sectional views showing the concept of the SOI substrate manufacturing method according to the second preferred embodiment of the present invention.

Figure 2A:
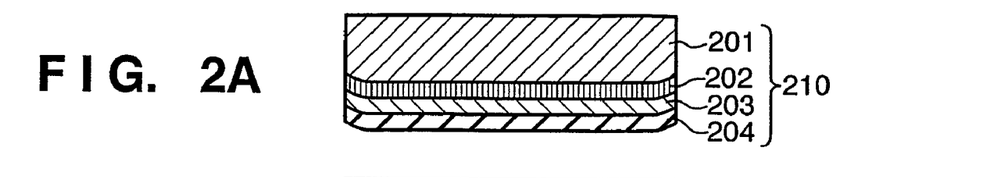
FIGS. 2A to 2F are sectional views showing the concept of an SOI substrate manufacturing method according to the second preferred embodiment of the present invention.

In the step shown in FIG. 2A, an Si substrate 201 such as an Si substrate is prepared. A porous layer 202 serving as a separation layer is formed on the major surface of the Si substrate 201. The porous Si layer 202 can be formed by, e.g., executing an anodizing process for the first substrate 201 in an electrolyte (formation solution).

As the electrolyte, for example, (1) a solution containing hydrogen fluoride, (2) a solution containing hydrogen fluoride and ethanol, or (3) a solution containing hydrogen fluoride and isopropyl alcohol is preferable. The porous layer 202 may have a multilayer structure including two or more layers having different porosities. The porous layer 202 having a multilayer structure preferably includes a first porous layer having a first porosity on the surface side, and a second porous layer having a second porosity higher than the first porosity under the first porous layer. The first porosity is preferably 10% to 30%, and more preferably, 15% to 25%. The second porosity is preferably 35% to 70%, and more preferably, 40% to 60%.

A semiconductor layer 203 as a first non-porous layer is formed on the porous Si layer 202. As the semiconductor layer 203, for example, a silicon layer such as a single-crystal silicon layer, polysilicon layer, or amorphous silicon layer, Ge layer, SiGe layer, SiC layer, C layer, GaAs layer, GaN layer, AlGaAs layer, InGaAs layer, InP layer, or InAs layer is preferable.

An insulating layer 204 as a second non-porous layer is formed on the semiconductor layer 203. As the insulator material of the insulating layer 204, for example, silicon oxide, silicon nitride, silicon oxynitride, aluminum oxide, tantalum oxide, hafnium oxide, titanium oxide, scandium oxide, yttrium oxide, gadolinium oxide, lanthanum oxide, zirconium oxide, or a mixture glass thereof is preferable.

Figure 2B:
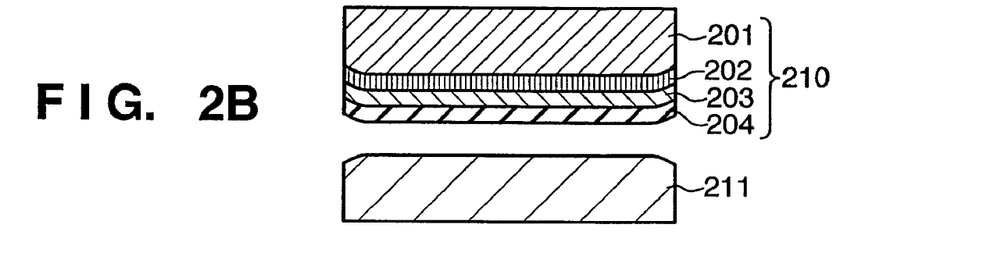

In the step shown in FIG. 2B, a second substrate 211 is prepared. As the second substrate 211, an Si substrate, Ge substrate, SiGe substrate, SiC substrate, C substrate, GaAs substrate, GaN substrate, AlGaAs substrate, InGaAs substrate, InP substrate, InAs substrate, a substrate obtained by forming an insulating layer on these substrates, a transparent substrate such as a quartz substrate, or a sapphire substrate is preferable. However, the second substrate 211 only needs to have a sufficiently flat bonding surface and can be of any other type.

Figure 2C:
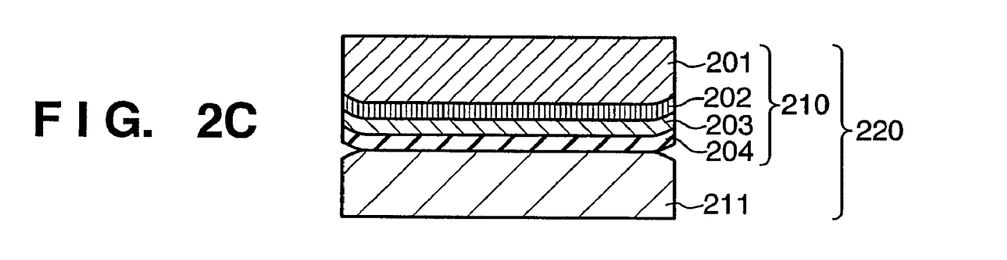

In the step shown in FIG. 2C, the first substrate 210 having the porous layer 202 and non-porous layers 203 and 204 is brought into contact with the second substrate 211 at room temperature while making the second substrate 211 face the insulating layer 204, thereby forming a bonded substrate 220. A process to make their bonding firm is executed as needed. This process can be performed in accordance with the same procedures as in the step shown FIG. 1C.

In the step shown in FIG. 2C, the bonded substrate 220 is divided into two parts at a boundary formed in the porous layer 202 having a low mechanical strength. Various kinds of methods can be employed for division. A method using a fluid is preferably used. For example, a fluid is injected into the porous layer 202, or a static pressure is applied to the porous layer 202 by a fluid.

Figure 2D:
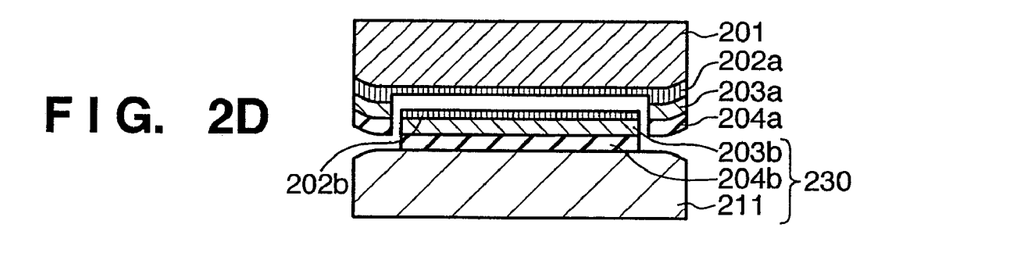

With this division step, the semiconductor layer 203 and insulating layer 204 are transferred onto the second substrate 211. Typically, the first substrate 201 and second substrate 211 have a beveling portion. The bonded substrate 220 has a peripheral portion with a gap formed by the beveling portions of the first substrate 201 and second substrate 211. In the division step, a crack initially occurs in the gap formed by the beveling portion, and then reaches the porous layer 202 in many cases. Therefore, the peripheral portions of the semiconductor layer 203 and insulating layer 204 may be removed in the division step. This makes the areas of a semiconductor layer 203b and insulating layer 204b smaller than those of the original semiconductor layer 203 and insulating layer 204. An SOI substrate 230 can be obtained by this process to have the insulating layer 204b, on which the semiconductor layer 203b is formed, as a buried insulator on the second substrate 211 serving as a support member.

Figure 2E:
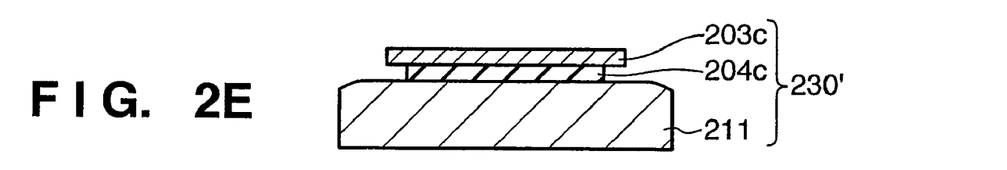
Figure 4:
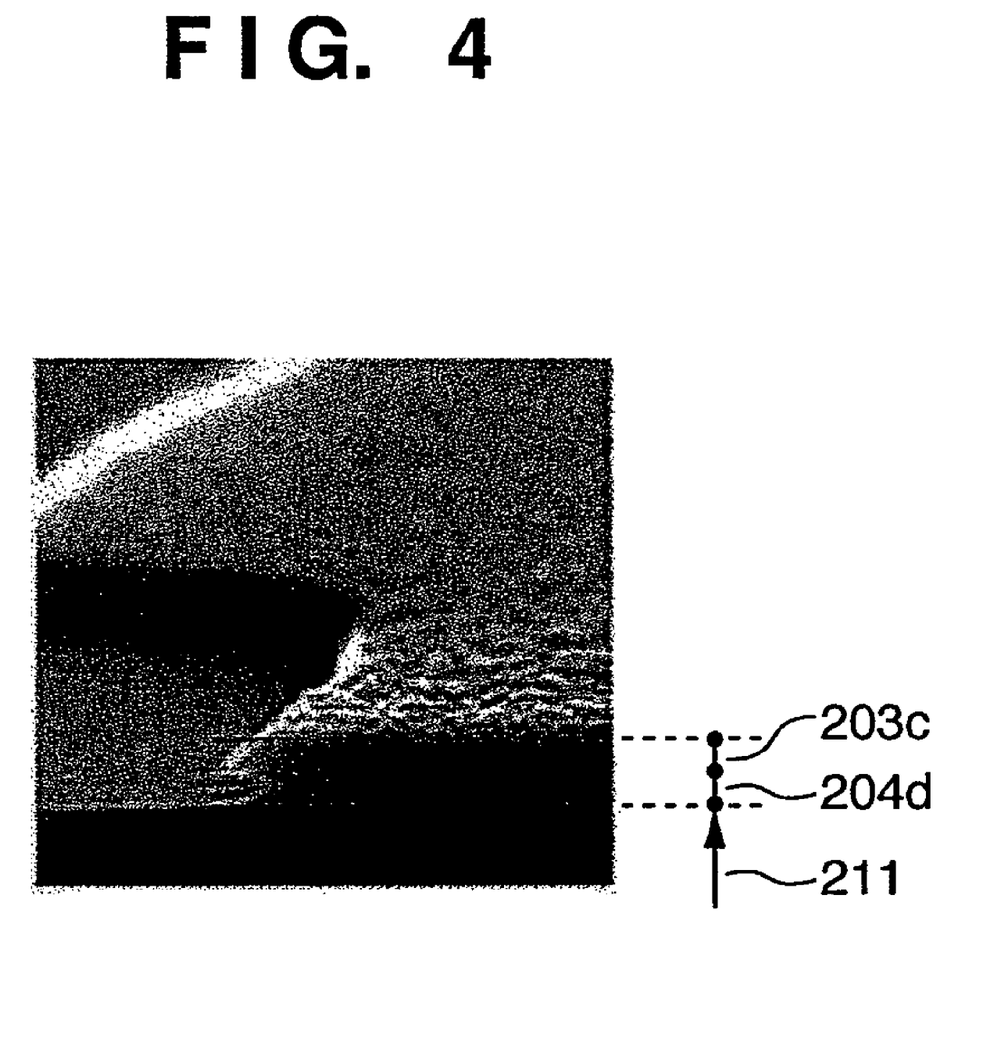
FIG. 4 is a view of a SEM photograph showing an example of a substrate 230' having undergone the process shown in FIG. 2E.

In the step shown in FIG. 2E, after a residual porous layer 202b is removed as needed, the peripheral portion of the insulating layer 204b is removed by, e.g., etching to make the position of the edge portion of the insulating layer 204b retreat inward (toward the center). This process can be executed by using an etching solution which can be used to selectively etch the insulating layer 204b with respect to the semiconductor layer 203b. For example, assume that the semiconductor layer 203b is formed of Si, and the insulating layer 204b is formed of an $SiO_2$ layer. In this case, the position of the edge portion of the insulating layer 204b can be made to retreat inward (toward the center) by supplying a solution containing hydrofluoric acid to the edge portion of the SOI substrate 230. This process makes it possible to obtain a structure in which a semiconductor layer 203c overhangs an insulating layer 204c. FIG. 4 is a view of a SEM photograph showing an example of a substrate 230' having undergone the process shown in FIG. 2E.

Figure 2F:
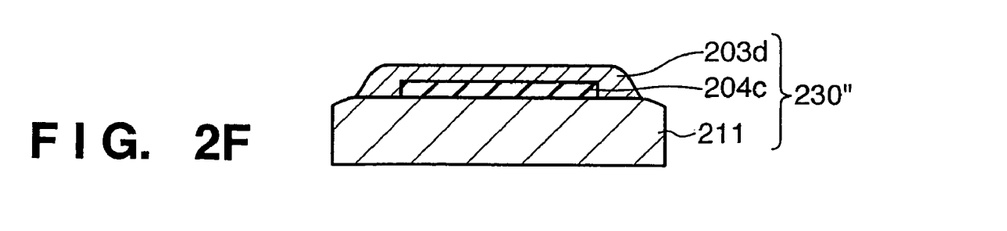
Figure 5:
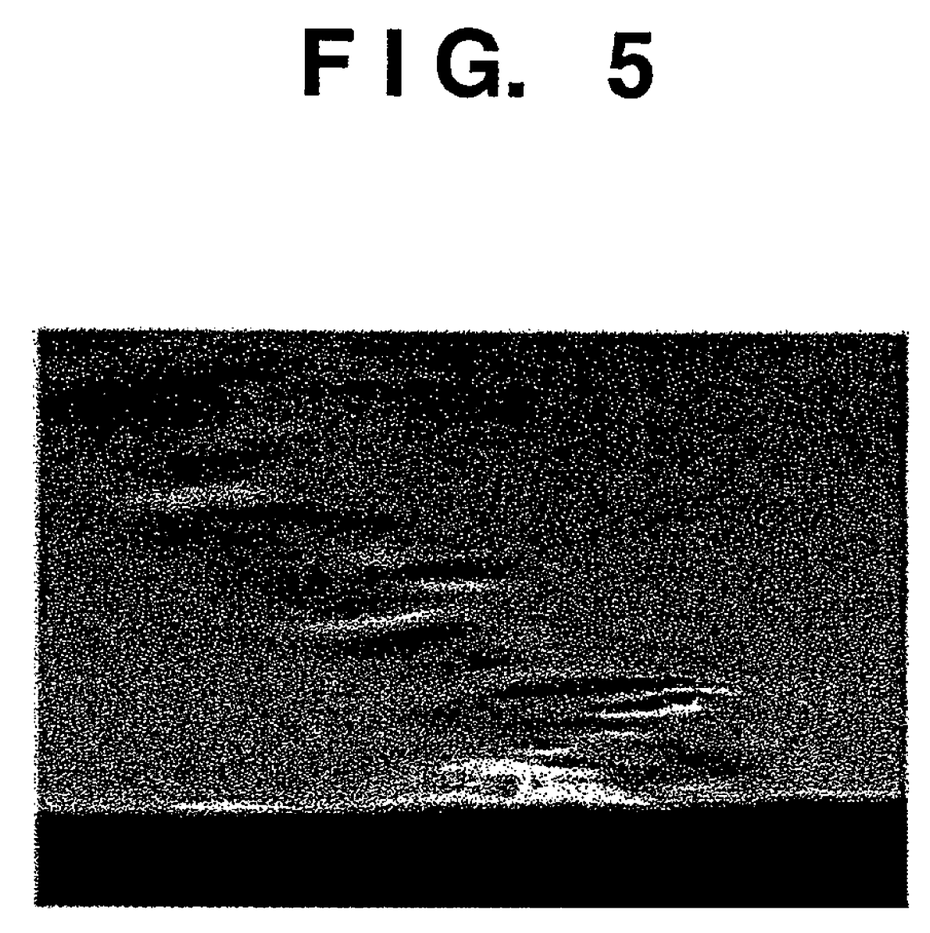
FIG. 5 is a view of a SEM photograph showing an example of a substrate 230" having undergone the process shown in FIG. 2F.

In the step shown in FIG. 2F, the peripheral portion of the semiconductor layer 203c is allowed to fall and connect to the second substrate 211. Hence, an SOI substrate 230" having a semiconductor layer (SOI layer) 203d can be obtained such that the semiconductor layer 203d has a moderately inclined peripheral portion and covers the edge portion of the insulating layer 204c. FIG. 5 is a view of a SEM photograph showing an example of the substrate 230" having undergone the process shown in FIG. 2F. With this structure of the SOI substrate 230", since the edge portion of the insulating layer 204c is covered with the semiconductor layer 203d, it is excellent in that it is possible to prevent the insulating layer 204c from being etched and the semiconductor layer 203d on it from flaking off in manufacturing devices on the SOI substrate 230".

This process may include annealing an SOI substrate 230' in a reducing atmosphere containing hydrogen. For example, preferably, 1) annealing is executed in an $N_2/H_2$ atmosphere at 1,050° C. for 3 hr, and subsequently, 2) annealing is executed in an $N_2/H_2$ atmosphere at 1,200° C. for 15 min.

Annealing in such reducing atmosphere containing hydrogen accelerates a reduction reaction required to etch the edge portion of the insulating layer (e.g., $SiO_2$ layer) 203c. In addition, atoms forming the edge portion of the semiconductor layer (e.g., Si layer) 203c migrate by heat so the edge portion falls. The semiconductor layer 203c is thus connected to the second substrate (e.g., Si substrate) 211 in crystal level.

Third Embodiment

A substrate manufacturing method according to the third preferred embodiment of the present invention will be described below. FIGS. 3A to 3F are sectional views showing the concept of the SOI substrate manufacturing method according to the third preferred embodiment of the present invention.

Figure 3A:
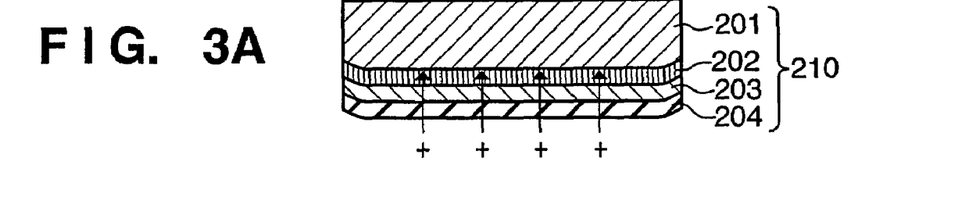
FIGS. 3A to 3F are sectional views showing the concept of an SOI substrate manufacturing method according to the third preferred embodiment of the present invention.

In the step shown in FIG. 3A, a first substrate 201 formed of a semiconductor such as Si is prepared. An insulating layer 204 is formed on the major surface of the first substrate 201. An ion-implanted layer 202 serving as a separation layer is formed by implanting ions such as hydrogen ions in a region at a predetermined depth of the first substrate 201. Of the overall first substrate 201, a region shallower than the ion-implanted layer 202 is a semiconductor layer 203. The ion-implanted layer 202 changes into a micro-cavity layer (which can be regarded as a kind of porous layer) by annealing. It is therefore possible to obtain almost the same structure as that of the first substrate 210 in the second embodiment by this method.

Figure 3B:
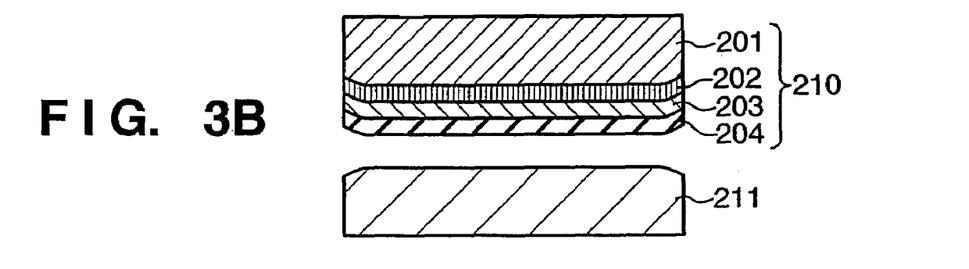

In the step shown in FIG. 3B, a second substrate 211 is prepared. As the second substrate 211, for example, an Si substrate, Ge substrate, SiGe substrate, SiC substrate, C substrate, GaAs substrate, GaN substrate, AlGaAs substrate, InGaAs substrate, InP substrate, InAs substrate, a substrate obtained by forming an insulating layer on these substrates, a transparent substrate such as a quartz substrate, or a sapphire substrate is preferable. However, the second substrate 211 only needs to have a sufficiently flat bonding surface and can be of any other type.

Figure 3C:
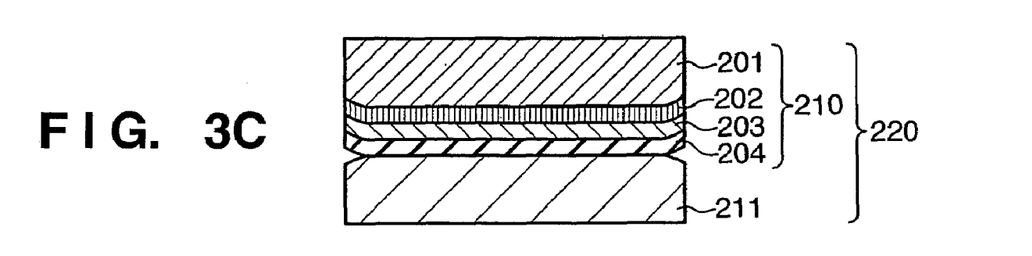

In the step shown in FIG. 3C, a first substrate 210 having the ion-implanted layer 202, semiconductor layer 203, and insulating layer 204 is brought into contact with the second substrate 211 at room temperature while making the second substrate 211 face the insulating layer 204, thereby forming a bonded substrate 220.

Figure 3D:
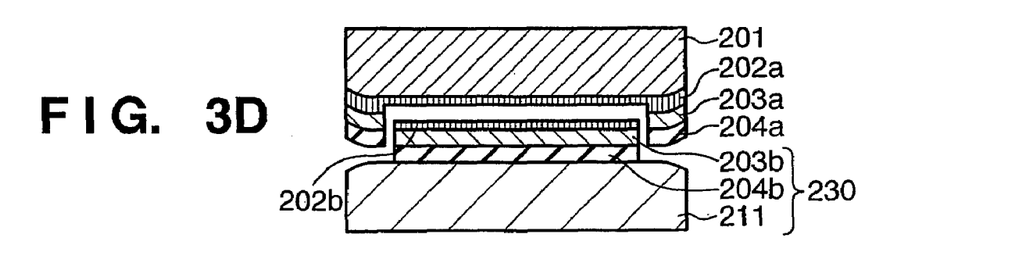

In the step shown in FIG. 3D, the bonded substrate 220 is subjected to annealing at 450° C. to 550° C. to change the ion-implanted layer 202 into a micro-cavity layer. The bonded substrate 220 is divided into two parts by promoting cleavage separation in the micro-cavity layer. Typically, cleavage separation readily occurs in the central portion (the inner side of the peripheral portion) due to stress. For this reason, the bonded substrate 220 is completely divided mostly before cleavage separation occurs in the peripheral portion. Therefore, the peripheral portions of the semiconductor layer 203 and insulating layer 204 may be removed in the division step. This makes the areas of a divided semiconductor layer 203b and insulating layer 204b smaller than those of the original semiconductor layer 203 and insulating layer 204. An SOI substrate 230 can be obtained by this process to have the insulating layer 204b, on which the semiconductor layer 203b is formed, as a buried insulator on the second substrate 211 serving as a support member.

Figure 3E:
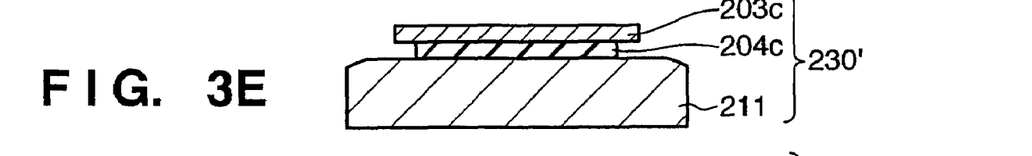

In the step shown in FIG. 3E, after a residual micro-cavity layer (residual porous layer) 202b is removed as needed, the peripheral portion of the insulating layer 204b is removed by, e.g., etching to make the position of the edge portion of the insulating layer 204b retreat inward (toward the center). This process can be executed by using an etching solution which can be used to selectively etch the insulating layer 204b with respect to the semiconductor layer 203b. For example, assume that the semiconductor layer 203b is formed of Si, and the insulating layer 204b is formed of an $SiO_2$ layer. In this case, the position of the edge portion of the insulating layer 204b can be made to retreat inward (toward the center) by supplying a solution containing hydrofluoric acid to the edge portion of the SOI substrate 230. This process makes it possible to obtain a structure in which a semiconductor layer 203c overhangs an insulating layer 204c.

Figure 3F:
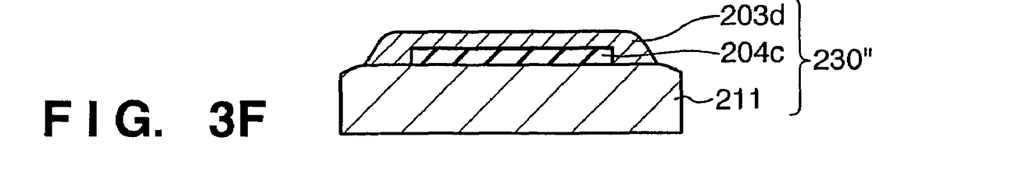

In the step shown in FIG. 3F, the peripheral portion of the semiconductor layer 203c is allowed to fall and connect to the second substrate 211. Hence, an SOI substrate 230" having a semiconductor layer (SOI layer) 203d can be obtained such that the semiconductor layer 203d has a moderately inclined peripheral portion and covers the edge portion of the insulating layer 204c. With this structure of the SOI substrate 230", since the edge portion of the insulating layer 204c is covered with the semiconductor layer 203d, it is excellent in that it is possible to prevent the insulating layer 204c from being etched and the semiconductor layer 203d on it from flaking off in manufacturing devices on the SOI substrate 230".

This process may include annealing an SOI substrate 230' in a reducing atmosphere containing hydrogen. For example, preferably, 1) annealing is executed in an $N_2/H_2$ atmosphere at 1,050° C. for 3 hr, and subsequently, 2) annealing is executed in an $N_2/H_2$ atmosphere at 1,200° C. for 15 min.

Annealing in such reducing atmosphere containing hydrogen accelerates a reduction reaction required to etch the edge portion of the insulating layer (e.g., $SiO_2$ layer) 204c. In addition, atoms forming the edge portion of the semiconductor layer (e.g., Si layer) 203c migrate by heat so the edge portion falls. The semiconductor layer 203c is thus connected to the second substrate (e.g., Si substrate) 211 in crystal level.

EXAMPLES

Some examples according to the present invention will be described below. However, these examples are not intended to limit the spirit and scope of the present invention.

Example 1

Example 1 corresponds to the first embodiment described above.

An Si substrate 101 having a thickness of 725 μm was prepared. The major surface of the Si substrate 101 was thermally oxidized to form a 75-nm thick $SiO_2$ layer 102 (FIG. 1A).

The $SiO_2$ layer 102 on the Si substrate 101 was bonded to an Si substrate 110. Annealing was executed at 1,000° C. for 130 min to increase the bonding strength between the $SiO_2$ layer 102 and Si substrate 111 (FIGS. 1B and 1C).

The lower surface (exposed surface) of the Si substrate 101 was ground 715 μm by using a grinder. Furthermore, mirror polishing was executed by using colloidal silica as abrasive grain. An SOI wafer 130 was obtained while leaving an Si film 101 having a thickness of 2 μm on the $SiO_2$ layer 102 (FIG. 1F).

The position of the edge portion of an insulating layer 102a was made to retreat inward (toward the center) by using hydrofluoric acid (FIG. 1E). Annealing was executed in an $N_2/H_2$ atmosphere at 1,050° C. for 3 hr to connect the Si substrate 111 to the peripheral portion of a semiconductor layer 101a while inclining it moderately (FIG. 1F). Hence, an SOI substrate 130" having a semiconductor layer (SOI layer) 101b could be obtained such that the semiconductor layer 101b had a moderately inclined peripheral portion and covered the edge portion of an insulating layer 102b.

Example 2

Example 2 corresponds to the second embodiment described above.

A p-type (100) Si substrate having a resistivity of 0.01 Ωcm was used as an Si substrate 201. After the Si substrate 201 was cleaned, anodizing was performed. Anodizing was executed at a current density of 10 mA/cm$^2$ for 14 min by using a solution prepared by mixing 49% hydrofluoric acid solution and alcohol solution at a ratio of 1:1. The thickness of a porous Si layer 202 was 15 μm (FIG. 2A).

Annealing was executed in an oxygen atmosphere at 400° C. for 60 min to stabilize the surface of the porous Si layer 202. Si was epitaxially grown on the porous Si layer 202 to form a 1-μm thick epitaxial Si layer 203. To check the quality of crystal of the epitaxial layer 203, crystal defect evaluation was done by secco etching. However, no defects were observed. The epitaxial Si layer 203 was thermally oxidized to form a 75-nm thick SiO$_2$ film 204 on the epitaxial Si layer 203 (FIG. 2A).

The SiO$_2$ film 204 formed on the Si substrate 201 was bonded to an Si substrate 211. Annealing was executed at 1,000° C. for 130 min to increase the bonding strength between the SiO$_2$ layer 204 and Si substrate 211 (FIGS. 2B and 2C).

A fluid wedge was driven into the porous Si layer 202 by water jet to divide a bonded substrate 220 into two parts at a boundary formed in the porous Si layer 202. A substrate 230 having a structure in which a porous Si layer 202b, epitaxial Si layer 203b, thermal oxide layer 204b, and Si substrate 211 were stacked was obtained (FIG. 2D).

The porous Si layer 202b was etched by using a solution mixture of hydrofluoric acid solution and hydrogen peroxide solution and applying an ultrasonic wave from the outside. The etching rate difference between the porous Si layer 202b and the epitaxial Si layer 203b in this solution is about ×100,000. Hence, the porous Si layer 202b could be etched without damaging the epitaxial Si layer 203b.

The position of the edge portion of the insulating layer 204b was made to retreat inward (toward the center) by using hydrofluoric acid (FIG. 2E). Annealing was executed in an N$_2$/H$_2$ atmosphere at 1,050° C. for 3 hr to connect the Si substrate 211 to the peripheral portion of an insulating layer 203d while inclining it moderately (FIG. 2F). Hence, an SOI substrate 230" having a semiconductor layer (SOI layer) 203d could be obtained such that the semiconductor layer 203d had a moderately inclined peripheral portion and covered the edge portion of an insulating layer 204c.

Example 3

Example 3 corresponds to the third embodiment described above.

An Si substrate 201 having a thickness of 725 μm was prepared. Thermal oxidation was executed to form a 75-nm thick SiO$_2$ layer 204 on the surface of the Si substrate 201 (FIG. 3A). An ion-implanted layer 202 was formed by implanting hydrogen ions in a region at a predetermined depth of the substrate 201. Of the overall first substrate 201, a region shallower than the ion-implanted layer 202 was a semiconductor layer 203.

An Si substrate 211 was bonded to the SiO$_2$ layer 204 on the Si substrate 201 to obtain a bonded substrate 220 (FIGS. 3B and 3C).

The bonded substrate 220 was subjected to annealing at 450° C. to 550° C. to change the ion-implanted layer 202 into a micro-cavity layer. The bonded substrate 220 was divided into two parts by promoting cleavage separation in the micro-cavity layer (FIG. 3D). Hence, an SOI substrate 230 could be obtained to have an insulating layer 204b, on which an semiconductor layer 203b was formed, as a buried insulator on the second substrate 211.

After a residual micro-cavity layer 202b was removed, the peripheral portion of the insulating layer 204b was removed by, e.g., etching to make the position of the edge portion of the insulating layer 204b retreat inward (toward the center) (FIG. 3E). Annealing was executed in an N$_2$/H$_2$ atmosphere at 1,050° C. for 3 hr to connect the Si substrate 211 to the peripheral portion of an insulating layer 203d while inclining it moderately (FIG. 3F). Hence, an SOI substrate 230" having a semiconductor layer (SOI layer) 203d could be obtained such that the semiconductor layer 203d had a moderately inclined peripheral portion and covered the edge portion of an insulating layer 204c.

As many apparently widely different embodiments of the present invention can be made without departing from the spirit and scope thereof, it is to be understood that the invention is not limited to the specific embodiments thereof except as defined in the appended claims.

CLAIM OF PRIORITY

This application claims priority from Japanese Patent Application No. 2004-363672 filed on Dec. 15, 2004, the entire contents of which is hereby incorporated by reference herein.

What is claimed is:

1. An SOI substrate manufacturing method, comprising:
   a first step of forming a structure in which an insulating layer and semiconductor layer are in turn formed on a semiconductor member by bonding a first substrate to a second substrate;
   a second step of making an edge portion of the insulating layer of the structure retreat toward a center so that an edge portion of the semiconductor layer overhangs the edge portion of the insulating layer; and
   a third step of moving atoms which form the edge portion of the semiconductor layer such that the edge portion of the semiconductor layer covers a periphery of the insulating layer and connects to the semiconductor member, wherein the third step includes a step of annealing the structure having undergone the second step in a reducing atmosphere containing hydrogen.

2. The method according to claim 1, wherein the semiconductor layer contains silicon.

3. The method according to claim 1, wherein the semiconductor layer and semiconductor member contain silicon.

4. The method according to claim 1, wherein the insulating layer contains silicon oxide.

5. The method according to claim 1, wherein the second step includes a step of etching an edge portion of an insulating layer exposed to a side surface of the structure by using an etching solution for selectively etching the insulating layer.

6. The method according to claim 1, wherein the first step includes a step of bonding the first substrate to the second substrate to form a bonded substrate having an insulating layer and second semiconductor member which are in turn formed on the semiconductor member, and a step of, while leaving one part of the second semiconductor member as the semiconductor layer, removing the other part of the second semiconductor member.

* * * * *